United States Patent
De La Cruz et al.

(10) Patent No.: US 7,317,343 B1
(45) Date of Patent: Jan. 8, 2008

(54) PULSE-GENERATION CIRCUIT WITH MULTI-DELAY BLOCK AND SET-RESET LATCHES

(75) Inventors: Louis De La Cruz, Pflugerville, TX (US); Hemanshu T. Vernenker, Santa Clara, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/257,641

(22) Filed: Oct. 25, 2005

(51) Int. Cl.
*H03K 3/00* (2006.01)

(52) U.S. Cl. ..................... 327/295; 327/293

(58) Field of Classification Search .............. 327/165, 327/166, 291, 293, 295, 296, 298
See application file for complete search history.

(56) References Cited

U.S. PATENT DOCUMENTS

| | | | | |
|---|---|---|---|---|
| 4,694,197 A * | 9/1987 | Sprague | ...................... | 327/153 |
| 5,059,818 A * | 10/1991 | Witt et al. | .................. | 327/175 |
| 5,448,192 A * | 9/1995 | Van De Wiel | .............. | 327/141 |
| 5,777,500 A * | 7/1998 | Eitrheim | ...................... | 327/174 |
| 6,031,401 A * | 2/2000 | Dasgupta | ..................... | 327/116 |
| 6,222,411 B1 * | 4/2001 | Chu et al. | .................... | 327/295 |
| 6,226,230 B1 * | 5/2001 | Watanabe | ................... | 368/113 |
| 6,323,706 B1 * | 11/2001 | Stark et al. | ................. | 327/175 |
| 6,437,650 B1 * | 8/2002 | Sung et al. | .................... | 331/25 |
| 6,452,435 B1 * | 9/2002 | Skergan et al. | ............. | 327/293 |
| 6,459,314 B2 * | 10/2002 | Kim | .......................... | 327/161 |
| 6,570,419 B2 * | 5/2003 | Hanzawa et al. | ........... | 327/152 |
| 6,707,331 B1 * | 3/2004 | Nguyen | ...................... | 327/166 |
| 7,126,396 B1 * | 10/2006 | Courcy | ....................... | 327/175 |
| 2003/0218490 A1 * | 11/2003 | Jang | .......................... | 327/291 |

\* cited by examiner

*Primary Examiner*—Linh My Nguyen
*Assistant Examiner*—William Hernandez
(74) *Attorney, Agent, or Firm*—Steve Mendelsohn

(57) ABSTRACT

In one embodiment of the invention, a pulse-generation circuit for generating control signals has clock-delay circuitry for generating a plurality of differently delayed clock signals. Each control signal is generated by a set-reset latch that receives its set and reset signals from different pulse generators operating based on different delayed clock signals from the clock-delay circuitry. In one implementation, the clock-delay circuitry has a partitioned delay block in which different sub-blocks provide different delay functionality to provide the clock-delay circuitry with programmable flexibility.

11 Claims, 7 Drawing Sheets

PULSE-GENERATION CIRCUIT WITH MULTI-DELAY BLOCK AND SET-RESET LATCHES

TECHNICAL FIELD

The present invention relates to electronics, and, in particular, to pulse-generation circuits that generate control signals, such as those used to access blocks of computer memory.

BACKGROUND

In a typical block of computer memory, memory cells are arranged in rows and columns, where the memory cells in each row are accessed using one or more word lines shared by those memory cells, and the memory cells in each column are accessed using one or more bit lines shared by those memory cells. The word lines and bit lines, as well as other circuitry associated with the memory block, are controlled using control signals (e.g., word-line enable, bit-line precharge, sense-amp enable, muxed bit-line precharge, write enable) whose relative timing must be accurately controlled in order for the memory block to operate correctly. For example, in certain conventional memory blocks, the bit-line precharge control signal, which is active low, must be de-asserted prior to the word-line enable control signal being asserted, and the bit-line precharge control signal must be asserted after the word-line enable control signal has been de-asserted. Conventional memory blocks rely on pulse-generation circuits to generate various control signals with appropriate relative timing. Such pulse-generation circuits must be able to operate properly under expected ranges of process, voltage, and temperature (PVT) characteristics.

FIG. 1 shows a schematic block diagram of a conventional pulse-generation circuit 100 for generating a word-line enable control signal (WL_EN) and a bit-line precharge control signal (BL_PCHGB). Pulse-generation circuit 100 comprises clock register 102, delay block 104, delay elements 106-110, multiplexers (muxes) M1-M3, and pulse generators 112-114. Each pulse generator comprises a logical-NAND gate and two inverters. Pulse-generation circuit 100 is designed to ensure that the rising edge of each pulse in control signal BL_PCHGB leads the rising edge of the corresponding pulse in control signal WL_EN, while the falling edge of each pulse in control signal BL_PCHGB trails the falling edge of the corresponding pulse in control signal WL_EN.

Clock register 102 receives (1) the result (CS.CE) of applying the logical-AND function to a chip select (CS) signal and a clock enable (CE) signal, (2) a clock signal CLK, and (3) a reset signal RST and presents clock signal CLK at its output as registered clock signal CSE_REG, if CS.CE is high and RST is low. If either CS.CE is low or RST is high, then clock signal CLK will not be forwarded to the clock register output. Reset signal RST is used to return control signals WL_EN and BL_PCHGB to their steady-state values (i.e., 0) after the end of each read or write operation in the memory block.

Delay block 104, typically implemented as a chain of inverters, receives registered clock signal CSE_REG at its input and presents, in this exemplary situation, four delayed versions (N1, N2, N3, and N4) of that clock signal, where each delayed clock signal Ni corresponds to the output of a different inverter in delay block 104. Note that the delay of N4 is greater than the delay of N3, which is greater than the delay of N2, which is greater than the delay on N1.

Delayed clock signal N1 is applied to the 0 input of mux M2 and to the input of delay element 108, whose output is applied to the 1 input of mux M2.

Delayed clock signal N2 is applied to one of the inputs of NAND gate 116 in pulse generator 112.

Delayed clock signal N3 is applied to the 0 input of mux M1 and to the input of delay element 106, whose output is applied to the 1 input of mux M1.

Delayed clock signal N4 is applied to the 0 input of mux M3 and to the input of delay element 110, whose output is applied to the 1 input of mux M3.

Muxes M1-M3 are individually controlled by configuration fuses F1-F3, respectively, to select either the corresponding delayed clock signal N1 or a further delayed version of that delayed clock signal, for forwarding to the corresponding pulse generator. Delay elements 106-110 and muxes M1-M3 provide programmable flexibility in the selection of the various delays generated by delay block 104. Note that the outputs of muxes M1 and M3 are inverted prior to application to NAND gates 116 and 118, respectively.

Table I identifies the logic processing of pulse generator 112 for different values of delayed clock signals N2 and N3. As indicated by the last column in Table I, the output of pulse generator 112 (i.e., control signal WL_EN) is high, if and only if N2 is high and N3 is low. The logic processing of pulse generator 114 is similar to that in Table I, such that the output of pulse generator 114 (i.e., control signal BL_PCHGB) is high, if and only if N1 is high and N4 is low.

TABLE I

| PULSE GENERATOR PROCESSING | | | | |
|---|---|---|---|---|
| N2 | N3 | N3B | NAND (N2, N3B) | INV |
| 0 | 0 | 1 | 1 | 0 |
| 1 | 0 | 1 | 0 | 1 |
| 1 | 1 | 0 | 1 | 0 |
| 0 | 1 | 0 | 1 | 0 |

FIG. 2 shows a timing diagram showing two consecutive clock cycles of the processing of pulse-generation circuit 100 of FIG. 1, when operating at a clock frequency well below the circuit's maximum frequency. As indicated in FIG. 2:

Each rising edge of clock N1 triggers the initiation of a pulse in control signal BL_PCHGB;

Each rising edge of clock N2 triggers the initiation of a pulse in control signal WL_EN;

Each falling edge of inverted clock N3B triggers the termination of a pulse in control signal WL_EN; and Each falling edge of inverted clock N4B triggers the termination of a pulse in control signal BL_PCHGB.

As further indicated in FIG. 2, for each clock cycle, the rising edge of each pulse in control signal BL_PCHGB leads the rising edge of the corresponding pulse in control signal WL_EN by time T1, while the falling edge of each pulse in control signal BL_PCHGB trails the falling edge of the corresponding pulse in control signal WL_EN by time T2. As such, pulse-generation circuit 100 provides the desired timing relationship between WL_EN and BL_PCHGB at this relatively low operating frequency.

FIG. 3 shows a timing diagram showing two consecutive clock cycles of the processing of pulse-generation circuit 100 of FIG. 1, when operating at a relatively high clock frequency. As indicated in FIG. 3, for the first clock cycle (CYCLE1):

The first rising edge of clock N1 triggers the initiation of a first pulse in control signal BL_PCHGB;

The first rising edge of clock N2 triggers the initiation of a first pulse in control signal WL_EN;

The first falling edge of inverted clock N3B triggers the termination of the first pulse in control signal WL_EN; and The first falling edge of inverted clock N4B triggers the termination of the first pulse in control signal BL_PCHGB.

Note that, at this high frequency, in the second clock cycle (CYCLE2), clock N1 rises before inverted clock N4B rises. As indicated in FIG. 3, as a result of this relationship, the rising edge of the second pulse in control signal BL_PCHGB is triggered by the rising edge of inverted clock N4B, instead of being triggered by the rising edge of clock N1. This results in the rising edge of the second pulse in control signal BL_PCHGB trailing, instead of leading, the rising edge of the second pulse in control signal WL_EN. This undesired result effectively limits the maximum frequency at which pulse-generation circuit 100 of FIG. 1 can operate properly.

SUMMARY

In one embodiment, the present invention is an integrated circuit having a pulse-generation circuit adapted to generate at least two control signals. The pulse-generation circuit comprises clock-delay circuitry, a plurality of pulse generators, and a plurality of set-reset latches. The clock-delay circuitry is connected to receive an input clock signal and is adapted to generate a plurality of differently delayed clock signals. Each pulse generator is connected to receive a different clock signal from the clock-delay circuitry and is adapted to generate a set signal or a reset signal having a pulse based on a transition in the received clock signal. Each set-reset latch is connected to receive one of the set signals at its set input and one of the reset signals at its reset input and adapted to generate one of the control signals.

In another embodiment, the present invention is a method and apparatus for generating at least first and second control signals. A plurality of differently delayed clock signals are generated based on an input clock signal. A plurality of set signals and a plurality of reset signals are generated, each having a pulse based on a transition in one of the delayed clock signals. Each control signal is generated based on one of the set signals and one of the reset signals.

In yet another embodiment, the present invention is an integrated circuit having a pulse-generation circuit adapted to generate at least two control signals. The pulse-generation circuit comprises clock-delay circuitry connected to receive an input clock signal and adapted to generate a plurality of differently delayed clock signals. The pulse-generation circuit further comprises circuitry adapted to generate the at least two control signals from the delayed clock signals. The clock-delay circuitry comprises a delay block connected to receive the input clock signal and configured to generate one or more differently delayed clock signals, where the delay block is partitioned to form two or more cascaded delay sub-blocks.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 4:
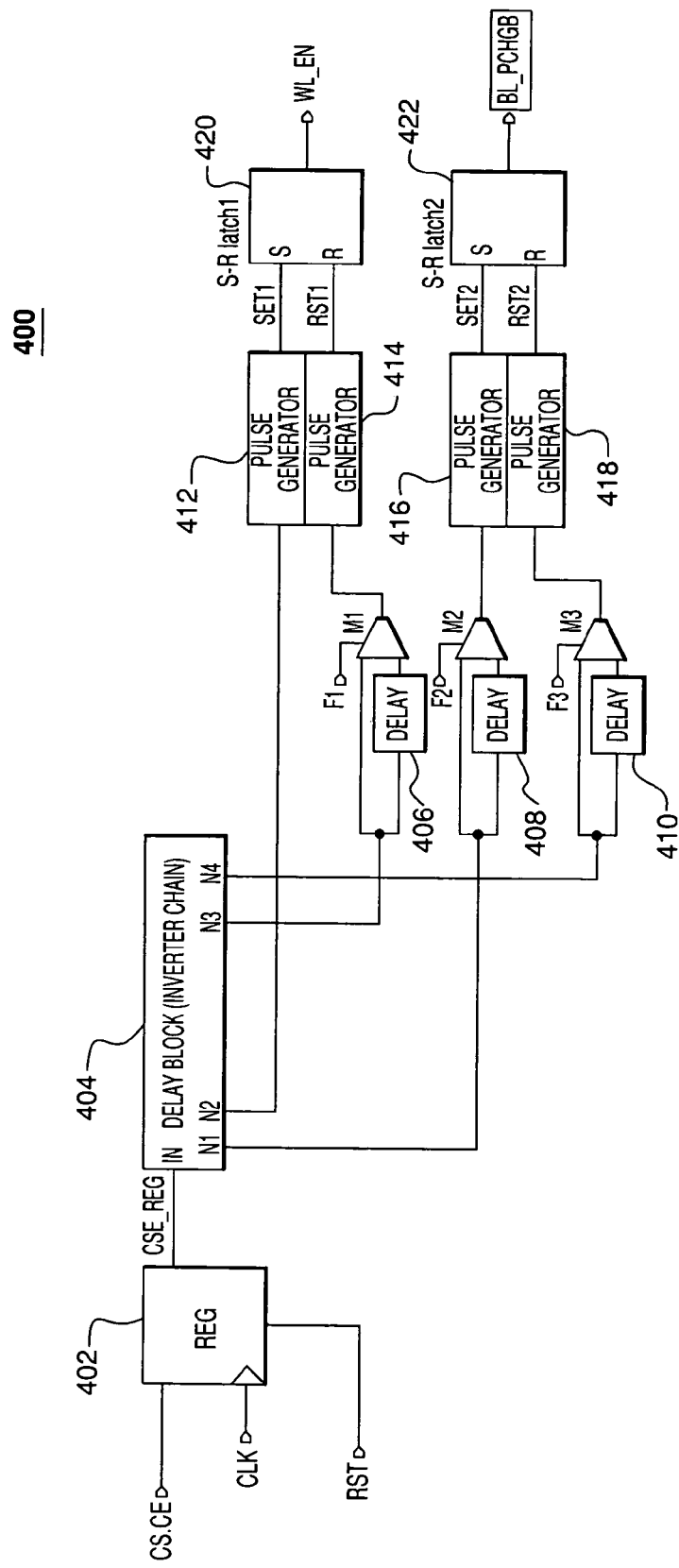
FIG. 4 shows a schematic block diagram of a pulse-generation circuit for generating a word-line enable control signal (WL_EN) and a bit-line precharge control signal (BL_PCHGB), according to one embodiment of the present invention.

FIG. 4 shows a schematic block diagram of a pulse-generation circuit 400 for generating a word-line enable control signal (WL_EN) and a bit-line precharge control signal (BL_PCHGB), according to one embodiment of the present invention. Pulse-generation circuit 400 comprises clock register 402, delay block 404, delay elements 406-410, and multiplexers (muxes) M1-M3, which are analogous to the corresponding elements in conventional pulse-generation circuit 100 of FIG. 1. In addition, pulse-generation circuit 400 includes pulse generators 412-418 and set-reset latches 420-422. Like pulse-generation circuit 100 of FIG. 1, pulse-generation circuit 400 is designed to ensure that the rising edge of each pulse in control signal BL_PCHGB leads the rising edge of the corresponding pulse in control signal WL_EN, while the falling edge of each pulse in control signal BL_PCHGB trails the falling edge of the corresponding pulse in control signal WL_EN. As described in further detail below, the maximum operating frequency (FMAX) of pulse-generation circuit 400 of the present invention can be greater than FMAX for a comparable implementation of conventional pulse-generation circuit 100.

Figure 5:
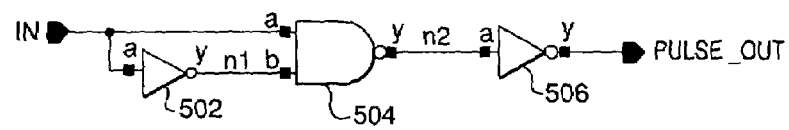
FIG. 5 shows a schematic diagram of an exemplary pulse generator that can be used to implement each of the pulse generators of FIG. 4.

FIG. 5 shows a schematic diagram of an exemplary pulse generator 500, which can be used to implement each of pulse generators 412-418 of FIG. 4. Pulse generator 500 comprises two inverters 502 and 506 and a logical-NAND gate 504. The input signal (IN) to pulse generator 500 is applied to one of the NAND gate inputs and to the input of inverter 502, whose output (n1) is applied to the other NAND gate input. The output (n2) of NAND gate 504 is inverted by inverter 506 to generate output signal PULSE_OUT of pulse generator 500.

Figure 6:
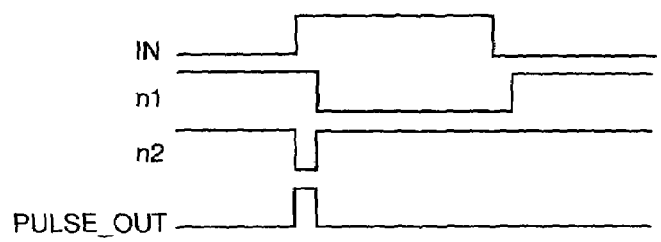
FIG. 6 shows a timing diagram of the processing of the pulse generator of FIG. 5.

FIG. 6 shows a timing diagram of the processing of pulse generator 500 of FIG. 5. As represented in FIG. 6, inverted signal n1 from inverter 502 trails input signal IN due to processing delays within the inverter. This timing offset results in NAND gate 504 generating a negative pulse at its output (n2), which is inverted by inverter 506 to form a positive pulse in output signal PULSE_OUT. Note that the duration of the pulse in PULSE_OUT can be increased by replacing single inverter 502 with an odd number of cascaded inverters. Note further that other suitable circuitry can be employed to implement each pulse generator in pulse-generation circuit 400 of FIG. 4.

As shown in FIG. 4:
Pulse generator 412 generates set signal SET1 based on delayed clock signal N2;
Pulse generator 414 generates reset signal RST1 based on delayed clock signal N3;
Pulse generator 416 generates set signal SET2 based on delayed clock signal N1;
Pulse generator 418 generates reset signal RST2 based on delayed clock signal N4.

Figure 7:
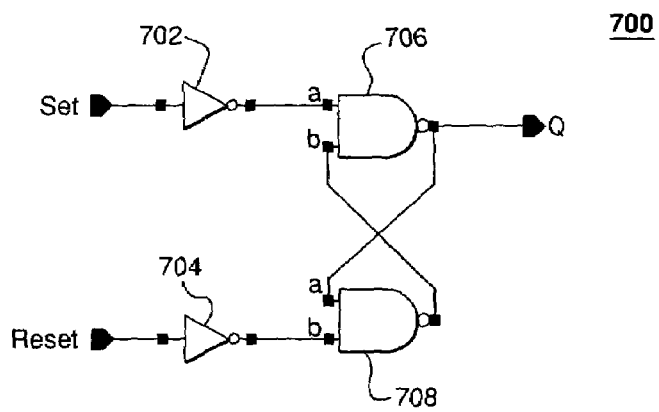
FIG. 7 shows a schematic diagram of an exemplary set-reset latch that can be used to implement each of the set-reset latches of FIG. 4.

FIG. 7 shows a schematic diagram of an exemplary set-reset latch 700, which can be used to implement each of set-reset latches 420-422 of FIG. 4. Set-reset latch 700 comprises two inverters 702 and 704 and two logical-NAND gates 706 and 708. If the set and reset signals applied to latch 700 are both low and the Q output of latch 700 is low, then asserting the set signal causes the Q output to go high. If the set signal is subsequently de-asserted, then the Q output stays high. Similarly, if the set and reset signals applied to latch 700 are both low and the Q output of latch 700 is high, then asserting the reset signal causes the Q output to go low. If the set signal is subsequently de-asserted, then the Q output stays low. Note that, when used to implement set-reset latch 420 of FIG. 4, the Q output of FIG. 7 is control signal WL_EN. Similarly, when used to implement set-reset latch 422 of FIG. 4, the Q output of FIG. 7 is control signal BL_PCHGB.

Figure 8:
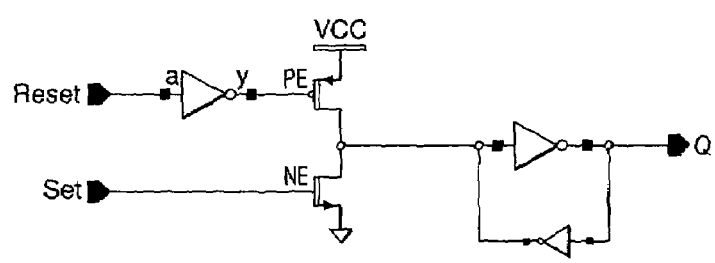
FIG. 8 shows a schematic diagram of another exemplary set-reset latch that can be used to implement each of the set-reset latches of FIG. 4.

FIG. 8 shows a schematic diagram of another exemplary set-reset latch 800, which can be used to implement each of set-reset latches 420-422 of FIG. 4. Latch 800 performs the same logical operations as latch 700 of FIG. 7, albeit with a different circuit configuration. Any other suitable circuitry for a set-reset latch can alternatively be used to implement the latches of FIG. 4.

Figure 9:
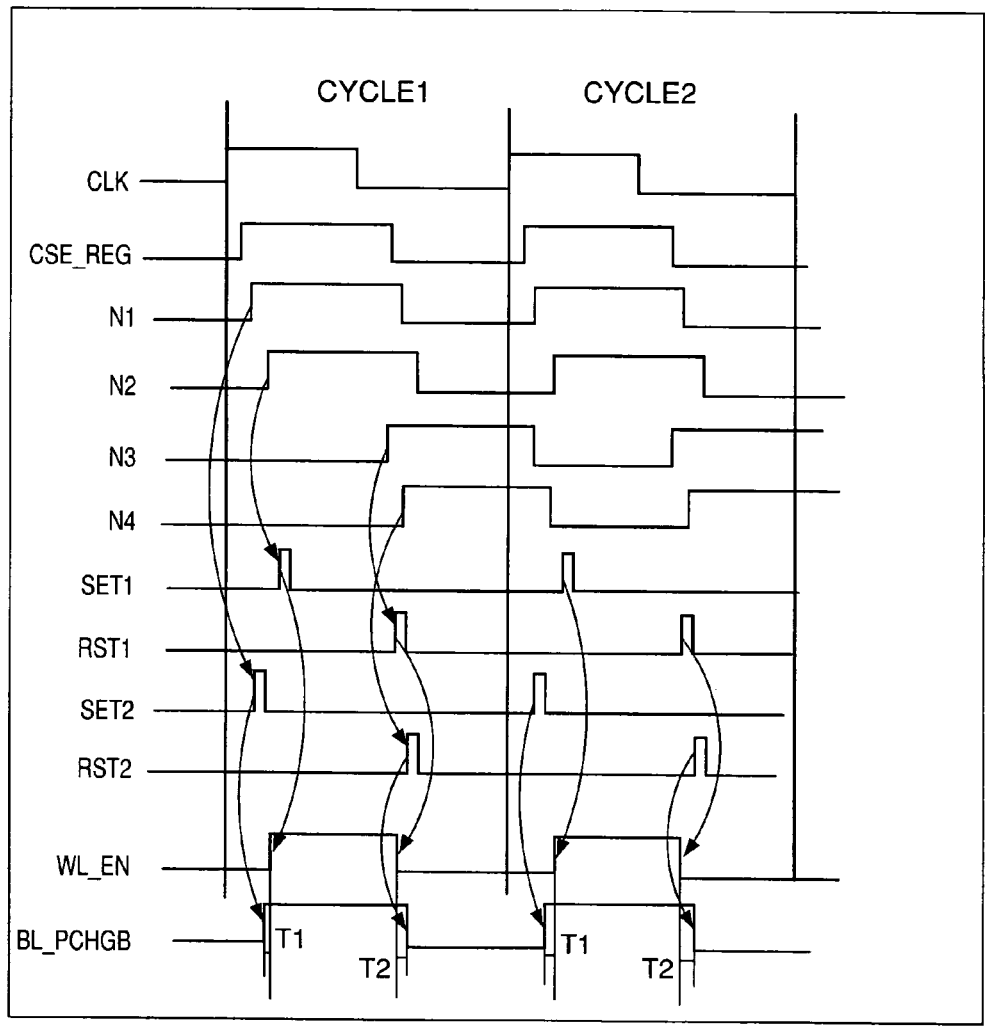
FIG. 9 shows a timing diagram showing two consecutive clock cycles of the processing of the pulse-generation circuit of FIG. 4.

FIG. 9 shows a timing diagram showing two consecutive clock cycles of the processing of pulse-generation circuit 400 of FIG. 4. As indicated in FIG. 9:
Each rising edge of clock N1 triggers the generation of a relatively short pulse in set signal SET2, which in turn triggers the initiation of a relatively long pulse in control signal BL_PCHGB;
Each rising edge of clock N2 triggers the generation of a relatively short pulse in set signal SET1, which in turn triggers the initiation of a relatively long pulse in control signal WL_EN;
Each rising edge of clock N3 triggers the generation of a relatively short pulse in reset signal RST1, which in turn triggers the termination of a relatively long pulse in control signal WL_EN; and
Each rising edge of clock N4 triggers the generation of a relatively short pulse in reset signal RST2, which in turn triggers the termination of a relatively long pulse in control signal BL_PCHGB.

As further indicated in FIG. 9, for each clock cycle, the rising edge of each pulse in control signal BL_PCHGB leads the rising edge of the corresponding pulse in control signal WL_EN by time T1, while the falling edge of each pulse in control signal BL_PCHGB trails the falling edge of the corresponding pulse in control signal WL_EN by time T2. As such, pulse-generation circuit 100 provides the desired timing relationship between WL_EN and BL_PCHGB.

Figure 1:
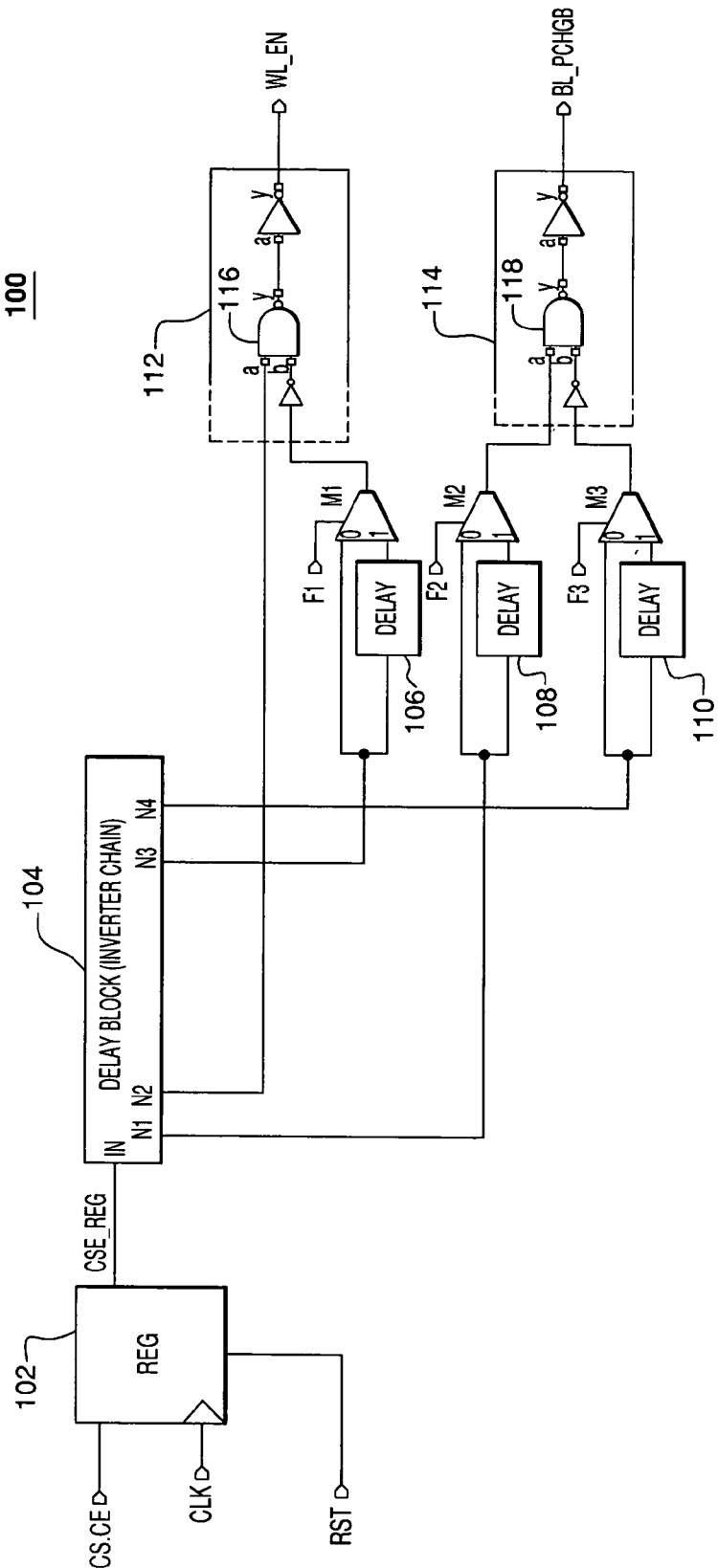
FIG. 1 shows a schematic block diagram of a conventional pulse-generation circuit for generating a word-line enable control signal (WL_EN) and a bit-line precharge control signal (BL_PCHGB)
Figure 2:
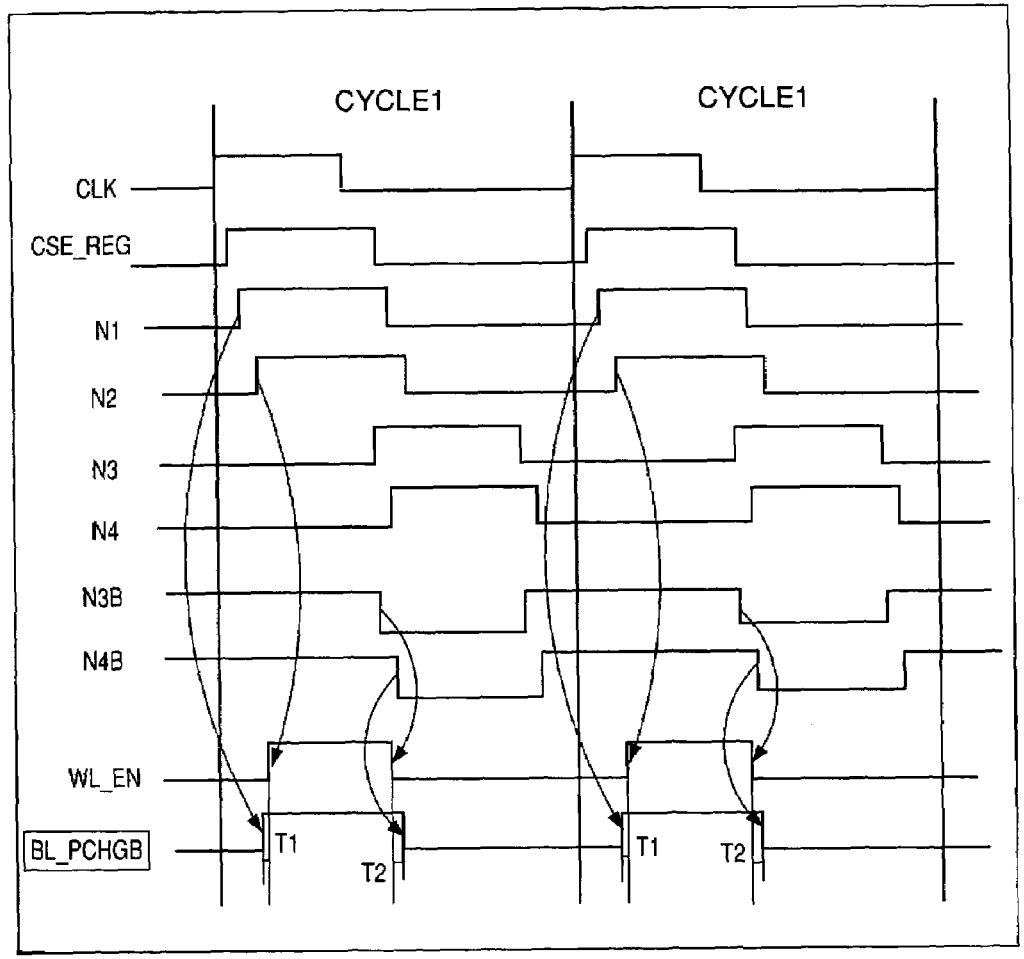
FIG. 2 shows a timing diagram showing two consecutive clock cycles of the processing of the pulse-generation circuit of FIG. 1, when operating at a clock frequency well below the circuit's maximum frequency.
Figure 3:
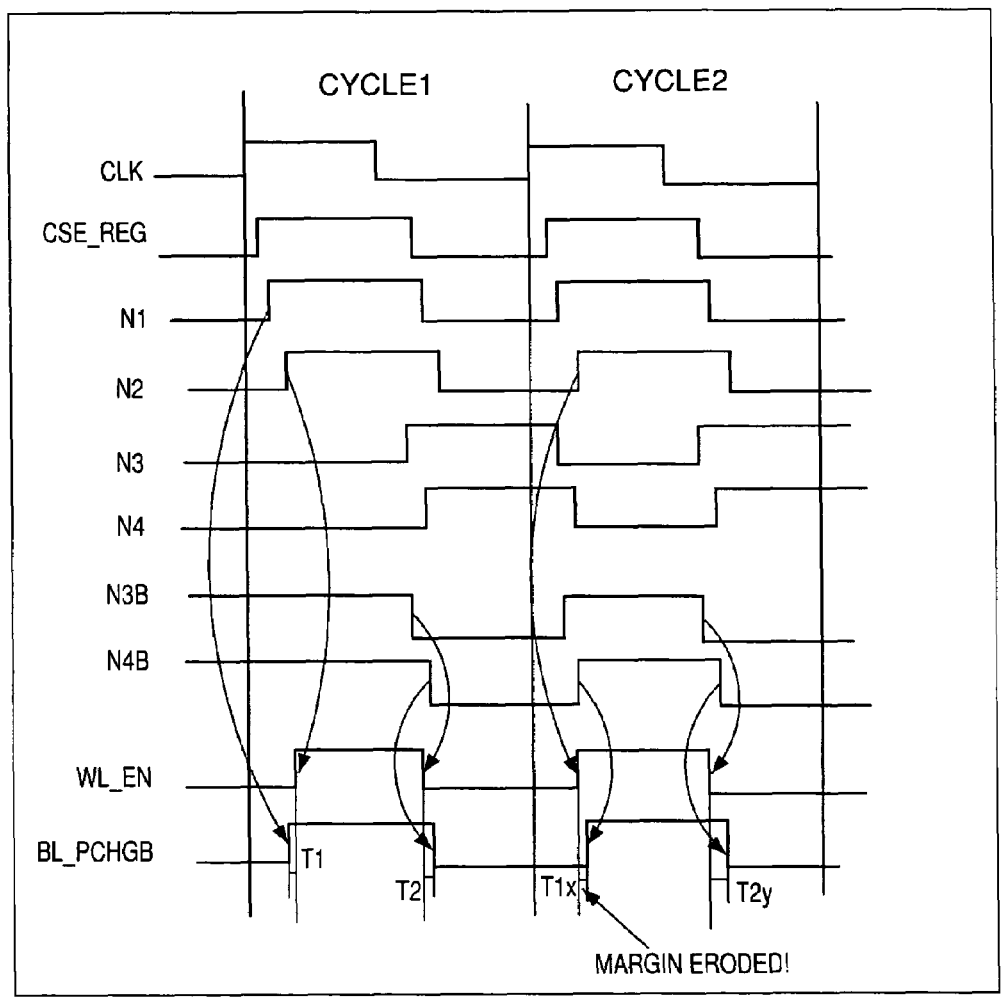
FIG. 3 shows a timing diagram showing two consecutive clock cycles of the processing of the pulse-generation circuit of FIG. 1, when operating at a relatively high clock frequency.

Since the beginning and end of the pulses in WL_EN and BL_PCHGB are triggered by relatively short pulses generated based on individual delayed clock signals, rather than by combinations of two different clock signals as in conventional pulse-generation circuit 100 of FIG. 1, the maximum frequency at which pulse-generation circuit 400 can operate is not limited by the internal processing of the various clock signals as it is in conventional pulse-generation circuit 100.

Figure 10:
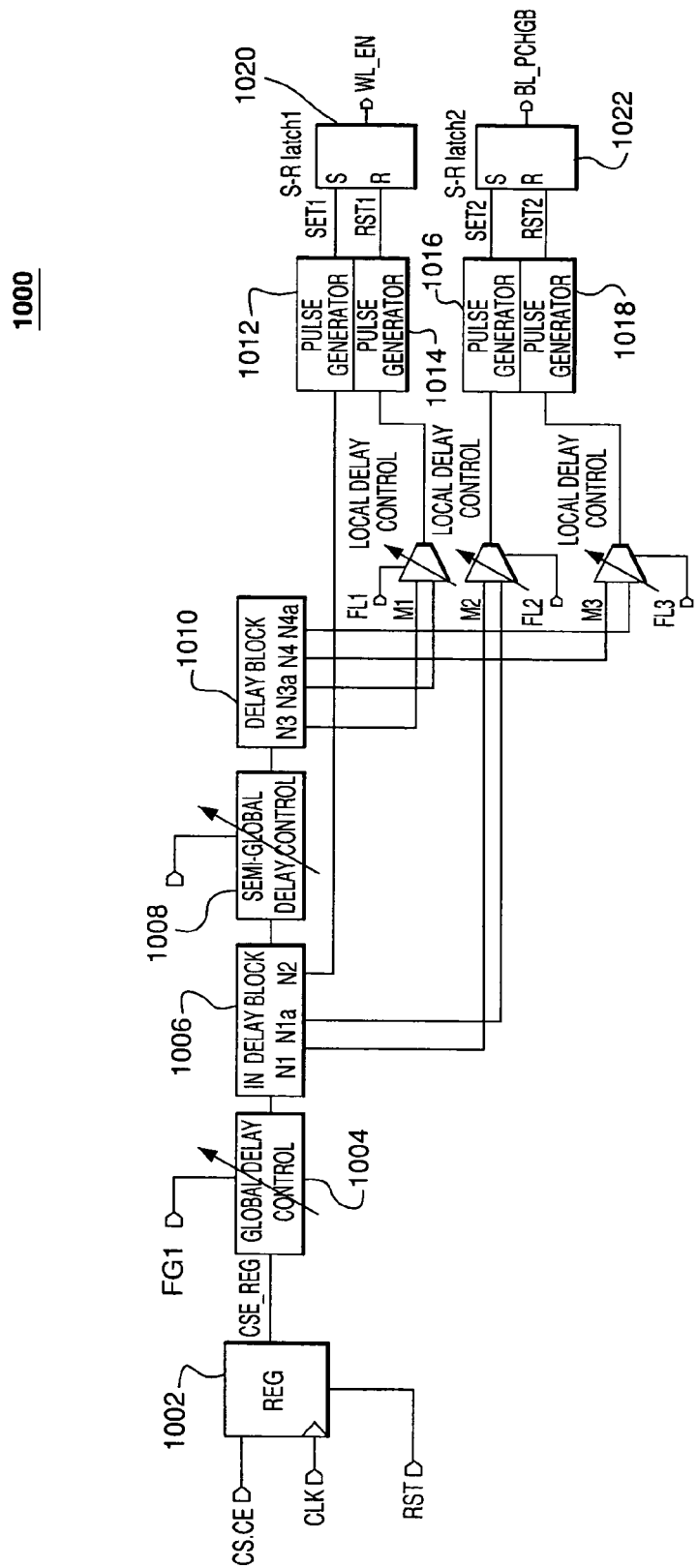
FIG. 10 shows a schematic block diagram of a pulse-generation circuit for generating a word-line enable control signal (WL_EN) and a bit-line precharge control signal (BL_PCHGB), according to another embodiment of the present invention.

FIG. 10 shows a schematic block diagram of a pulse-generation circuit 1000 for generating a word-line enable control signal (WL_EN) and a bit-line precharge control signal (BL_PCHGB), according to another embodiment of the present invention. Pulse-generation circuit 1000 comprises clock register 1002, pulse generators 1012-1018, and set-reset latches 1020-1022, which are analogous to the corresponding elements in pulse-generation circuit 400 of FIG. 4. In addition, pulse-generation circuit 1000 includes global delay element 1004, first delay block 1006, semi-global delay element 1008, second delay block 1010, and muxes M1-M3. These latter elements provide additional programmable flexibility in the selection of the various delays beyond that provided in pulse-generation circuit 400 of FIG. 4. In particular, each of global delay element 1004, semi-global delay element 1008, and muxes M1-M3 is individually controllable by a corresponding configuration fuse FG1, FSG1, FL1, FL2, and FL3, respectively.

In one possible implementation of pulse-generation circuit 1000, global delay element 1004, first delay block 1006, semi-global delay element 1008, and second delay block 1010 are implemented by partitioning a delay block equivalent to delay block 404 of FIG. 4 into a number of sub-blocks, each of which has one or more inverters. As a result, pulse-generation circuit 1000 provides clock delays with programmable flexibility without having to implement any additional delay elements, such as delay elements 406-410 of FIG. 4. Alternative embodiments of pulse-generation circuits may employ different schemes for partitioning a delay block, including different numbers of global, semi-global, and local delay blocks (i.e., those selected by muxes M1-M3). For example, an exemplary partitioning scheme might employ no global delay blocks, three semi-global delay blocks (e.g., one between N1 and N2, a second between N2 and N3, and a third between N3 and N4), and a local delay block for only SET2. Also, while only one fuse per delay element has been shown, additional flexibility may be provided by using muxes with more than two inputs and adding more configuration fuses to control the selections by those muxes.

Although the present invention has been described in the context of pulse-generation circuits designed to generate two particular control signals (i.e., WL_EN and BL_PCHGB) having specific desired timing relationships between their rising and falling edges, the present invention is not so limited. In general, the present invention can be implemented in the context of other pulse-generation circuits, including those designed to generate other types and other numbers of control signals having different timing relationships.

The present invention can be implemented for any circuitry having blocks of memory, including dedicated memory devices as well as circuits having embedded memory, e.g., application-specific integrated circuits (ASICs) and programmable devices such as field-programmable gate arrays (FPGAs), programmable logic devices (PLDs), mask-programmable gate arrays (MPGAs), simple programmable logic device (SPLDs), and complex programmable logic devices (CPLDs).

The memory blocks may comprise any suitable type of memory cell, including, but not limited to, static random access memory (SRAM) cells, dynamic RAM (DRAM) cells, virtual DRAM cells, and single transistor cells.

Although the present invention has been described in the context of pulse-generation circuits that generate control signals for accessing blocks of computer memory, the present invention can also be implemented in the context of pulse-generation circuits that generate control signals for other types of circuitry.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. An integrated circuit having a pulse-generation circuit for generating at least two control signals, the pulse-generation circuit comprising:
    clock-delay circuitry connected to receive an input clock signal and generate a plurality of differently delayed clock signals;
    a plurality of pulse generators, each connected to receive a different clock signal from the clock-delay circuitry and generate a set signal or a reset signal having a pulse based on a transition in the received clock signal; and
    a plurality of set-reset latches, each connected to receive one of the set signals at its set input and one of the reset signals at its reset input and generate one of the control signals, wherein the clock-delay circuitry comprises:
    a delay block having a full set of inverters partitioned to form at least three cascaded delay sub-blocks, each delay sub-block comprising one or more series-connected inverters corresponding to a different subset of the inverters in the full set, the at least three delay sub-blocks comprising:
        a first delay sub-block that generates one or more delayed clock signals, each delayed clock signal corresponding to a different inverter output in the first delay sub-block;
        a second delay sub-block that is connected to the first delay sub-block and functions as an individually controllable semi-global delay element; and
        a third delay sub-block that is connected to the second delay sub-block and generates one or more other delayed clock signals, each other delayed clock signal corresponding to a different inverter output in the third delay sub-block; and
    at least one individually controllable mux that receives at least two delayed clock signals directly from the partitioned delay block and selects one of the at least two directly-received delayed clock signals as a clock signal for one of the pulse generators.

2. The invention of claim 1, wherein the pulse-generation circuit generates control signals associated with operations of a memory block.

3. The invention of claim 2, wherein a first control signal is a word-line enable control signal and a second control signal is a bit-line precharge control signal.

4. The invention of claim 1, wherein:
    the plurality of pulse generators comprises:
        a first pulse generator connected to receive a first clock signal from the clock-delay circuitry and generate a first set signal having a pulse based on a transition in the first clock signal;
        a second pulse generator connected to receive a second clock signal from the clock-delay circuitry and generate a first reset signal having a pulse based on a transition in the second clock signal;
        a third pulse generator connected to receive a third clock signal from the clock-delay circuitry and generate a second set signal having a pulse based on a transition in the third clock signal; and
        a fourth pulse generator connected to receive a fourth clock signal from the clock-delay circuitry and generate a second reset signal having a pulse based on a transition in the fourth clock signal; and
    the plurality of set-reset latches comprises:
        a first set-reset latch connected to receive the first set signal at its set input and the first reset signal at its reset input and generate a first control signal; and
        a second set-reset latch connected to receive the second set signal at its set input and the second reset signal at its reset input and generate a second control signal.

5. The invention of claim 4, wherein the pulse-generation circuit maintains a desired timing relationship between corresponding pulses in the first and second control signals over a range of operating frequencies of the pulse-generation circuit.

6. The invention of claim 1, wherein the clock-delay circuitry further comprises:
    at least one additional delay element connected to receive a delayed clock signal from the delay block and further delay the received delayed clock signal; and
    an additional mux connected to receive the delayed clock signal from the delay block and the further delayed clock signal from the additional delay element and selectively provide one of its inputs as a clock signal applied to a corresponding pulse generator.

7. The invention of claim 1, wherein the semi-global delay element is controlled by a configuration fuse in the integrated circuit.

8. The invention of claim 1, wherein the at least three cascaded delay sub-blocks further comprise a fourth delay sub-block that is connected to the first delay sub-block and functions as an individually controllable global delay element.

9. The invention of claim 8, wherein the global delay element is controlled by a configuration fuse in the integrated circuit.

10. The invention of claim 1, wherein the at least one mux is controlled by a configuration fuse in the integrated circuit.

11. The invention of claim 4, wherein:

the at least one mux comprises individually controllable first, second, and third muxes;

the first pulse generator is connected to receive the first clock signal directly from the first delay sub-block;

the first mux is connected to receive two different clock signals directly from the second delay sub-block and selectively provide one of its inputs as the second clock signal to the second pulse generator;

the second mux is connected to receive two different clock signals directly from the first delay sub-block and selectively provide one of its inputs as the third clock signal to the third pulse generator; and the third mux is connected to receive two different clock signals directly from the second delay sub-block and selectively provide one of its inputs as the fourth clock signal to the fourth pulse generator.

* * * * *